(12) United States Patent  
Chang et al.

(10) Patent No.: US 12,512,436 B2  
(45) Date of Patent: Dec. 30, 2025

(54) ELECTRONIC PACKAGE STRUCTURE AND CHIP THEREOF

(71) Applicant: REALTEK SEMICONDUCTOR CORP., Hsinchu (TW)

(72) Inventors: Chia-Lin Chang, Hsinchu (TW); Yun-Tse Chen, Hsinchu (TW); Kai-Yin Liu, Hsinchu (TW); Cheng-Cheng Yen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 478 days.

(21) Appl. No.: 17/842,085

(22) Filed: Jun. 16, 2022

(65) Prior Publication Data

US 2023/0139424 A1   May 4, 2023

(30) Foreign Application Priority Data

Oct. 28, 2021   (TW) .................................. 110139997

(51) Int. Cl.
*H01L 23/00* (2006.01)

(52) U.S. Cl.
CPC .............. *H01L 24/48* (2013.01); *H01L 24/06* (2013.01); *H01L 24/49* (2013.01);
(Continued)

(58) Field of Classification Search
CPC ......... H01L 24/48; H01L 24/06; H01L 24/04; H01L 24/05; H01L 24/07; H01L 24/28; H01L 24/29; H01L 24/32; H01L 24/34; H01L 24/36; H01L 24/44; H01L 24/45; H01L 24/46; H01L 24/47; H01L 23/495; H01L 23/49503; H01L 23/49517;
(Continued)

(56) References Cited

U.S. PATENT DOCUMENTS 5,422,435 A * 6/1995 Takiar ..................... H01L 24/49
361/813
6,097,098 A * 8/2000 Ball ........................ H01L 24/10
257/691

(Continued)

FOREIGN PATENT DOCUMENTS

TW   200725764 B   7/2007
TW     1300963 B   9/2008

*Primary Examiner* — Natalia A Gondarenko
(74) *Attorney, Agent, or Firm* — Li & Cai Intellectual Property (USA) Office

(57) ABSTRACT

An electronic package structure and a chip thereof are provided. The electronic package structure includes a supporting element, a chip, an internal bonding wire, and a plurality of external bonding wires. The supporting element has a chip arrangement portion. The chip has a first surface and a second surface opposite to the first surface. The chip is arranged on the chip arrangement portion with the second surface facing toward the supporting element. The chip includes a first common pad and an individual core pad that are disposed on the first surface. The internal bonding wire is connected between the first common pad and the individual core pad. The external bonding wires are connected between the chip and the supporting element, in which a first external bonding wire of the external bonding wires and the internal bonding wire are jointly connected to the first common pad.

12 Claims, 3 Drawing Sheets

(52) U.S. Cl.
CPC ............... *H01L 2224/04042* (2013.01); *H01L 2224/06177* (2013.01); *H01L 2224/48227* (2013.01); *H01L 2224/49112* (2013.01)

(58) Field of Classification Search
CPC ......... H01L 23/49524; H01L 23/49531; H01L 23/49537; H01L 23/49541; H01L 23/49575; H01L 23/49582; H01L 29/732; H01L 29/7325; H01L 29/7391; H01L 29/7393; H01L 29/7395; H01L 29/7396; H01L 29/7397; H01L 29/0839; H01L 29/861; H01L 29/0834; H01L 23/473; H01L 24/42–49; H01L 2224/42; H01L 2224/49505; H01L 2224/49175; H01L 2225/06506; H01L 2225/0651; H01L 2225/1052; H01L 29/16; H01L 29/407; H01L 29/8613; H01L 29/8725; H01L 2924/13055; H01L 23/498; H01L 23/49811; H01L 23/49833; H01L 23/49838; H01L 23/49861; H01L 23/50; H01L 23/522; H01L 23/53209; H01L 23/5386; H01L 2224/04042; H01L 2224/06177; H01L 2224/48227; H01L 2224/49112; G01K 7/015; G01K 1/00

USPC .......... 257/666, 470, 109, 678, 714, 29.347, 257/29.166

See application file for complete search history.

(56) References Cited

U.S. PATENT DOCUMENTS

| | | | | |
|---|---|---|---|---|
| 6,107,681 | A * | 8/2000 | Lin | H01L 23/60 |
| | | | | 438/106 |
| 6,476,506 | B1 * | 11/2002 | O'Connor | H01L 24/06 |
| | | | | 257/773 |
| 6,982,220 | B1 * | 1/2006 | Liou | H01L 23/645 |
| | | | | 257/E23.024 |
| 9,240,372 | B1 * | 1/2016 | Liou | H01L 23/60 |
| 2007/0075424 | A1 * | 4/2007 | Nakanishi | H01L 23/525 |
| | | | | 257/737 |
| 2008/0029860 | A1 * | 2/2008 | Gao | H01L 24/49 |
| | | | | 257/E23.051 |

* cited by examiner

ELECTRONIC PACKAGE STRUCTURE AND CHIP THEREOF

CROSS-REFERENCE TO RELATED PATENT APPLICATION

This application claims the benefit of priority to Taiwan Patent Application No. 110139997, filed on Oct. 28, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic package structure and a chip thereof, and more particularly to an electronic package structure and a chip thereof packaged by a wire-bonding process.

BACKGROUND OF THE DISCLOSURE

In common chip packaging technologies, a wire-bonding technology is usually used to package a chip that has simpler functions and relatively low cost. To be more specific, in a chip package structure that is fabricated by using the wire-bonding technology, a plurality of input/output pads of a chip are usually arranged along edges of the chip for ease of wire-bonding.

Since the input/output pads for being electrically connected to an external circuit are arranged in a peripheral area of the chip, a power path for a plurality of devices (for example, transistors) that are located in a central area of the chip is longer, which results in a larger parasitic resistance. When power is supplied to the chip, the parasitic resistance of the power path causes an IR drop (or a voltage drop) and a low power integrity. Specifically, when the chip has a larger size, an effect of the IR drop becomes more severe. Accordingly, how a structure of the chip package structure can be modified to improve the power integrity during supplying power to the chip package structure remains one of the important issues to be solved in the relevant industry.

SUMMARY OF THE DISCLOSURE

In response to the above-referenced technical inadequacies, the present disclosure provides an electronic package structure and a chip thereof that can prevent power integrity from being reduced.

In one aspect, the present disclosure provides an electronic package structure including a supporting element, a chip, an internal bonding wire, and a plurality of external bonding wires. The supporting element has a chip arrangement portion. The chip has a first surface and a second surface opposite to the first surface. The chip is arranged on the chip arrangement portion with the second surface facing toward the supporting element. The chip includes a first common pad and an individual core pad that are disposed on the first surface. The internal bonding wire is connected between the first common pad and the individual core pad. The external bonding wires are connected between the chip and the supporting element, in which a first external bonding wire of the external bonding wires and the internal bonding wire are jointly connected to the first common pad.

In another aspect, the present disclosure provides a chip having a first surface and a second surface opposite to the first surface. The chip includes a first common pad and an individual core pad that are disposed on the first surface, and an area of the first common pad is greater than an area of the individual core pad.

Therefore, in the electronic package structure and the chip thereof provided by the present disclosure, by virtue of "the chip including the first common pad and the individual core pad disposed on the first surface," "the internal bonding wire being connected between the first common pad and the individual core pad," and "the internal bonding wire and a first external bonding wire of the external bonding wires being jointly connected to the first common pad," the power integrity of the electronic package structure can be prevented from being reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
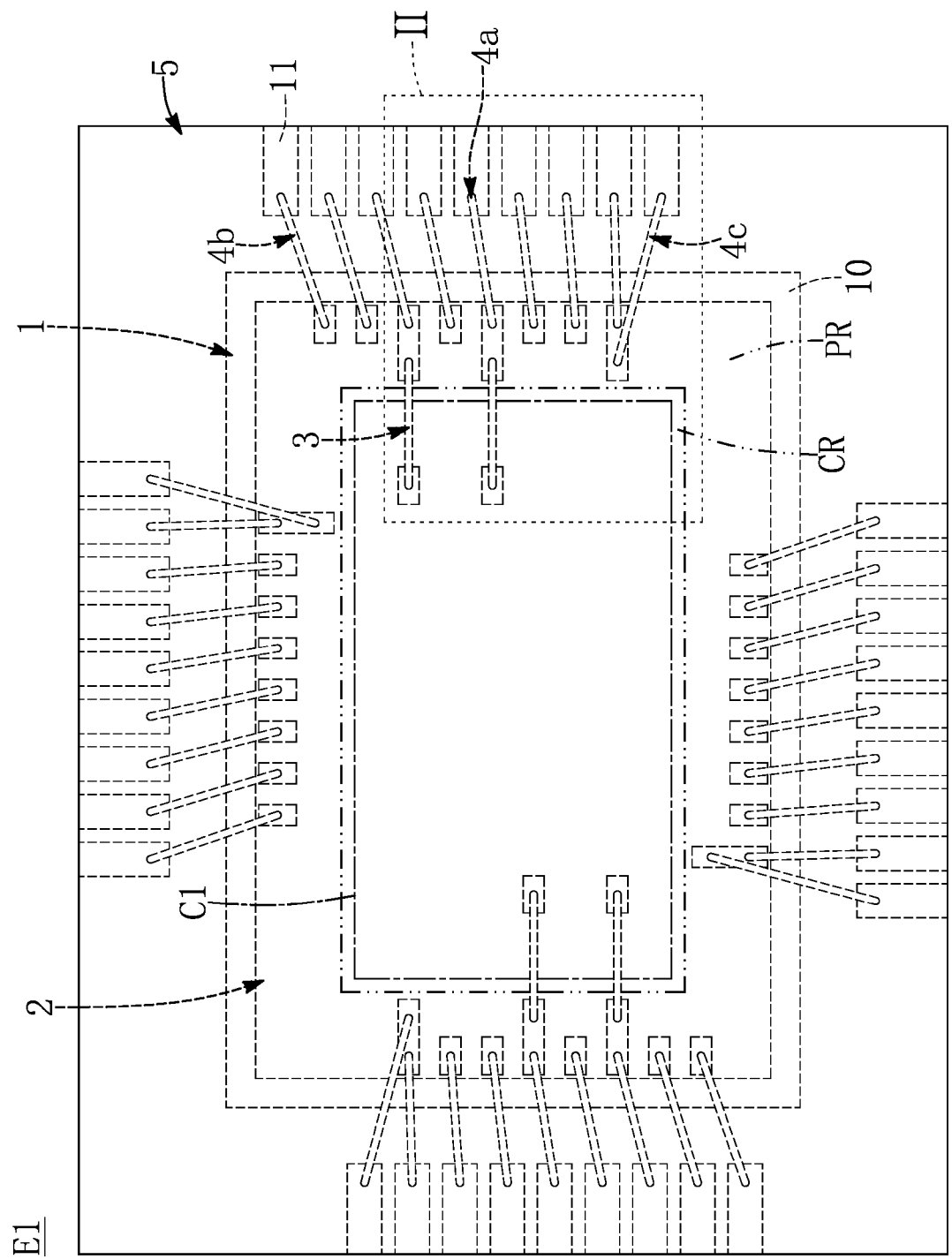
FIG. 1 is a schematic top view of an electronic package structure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
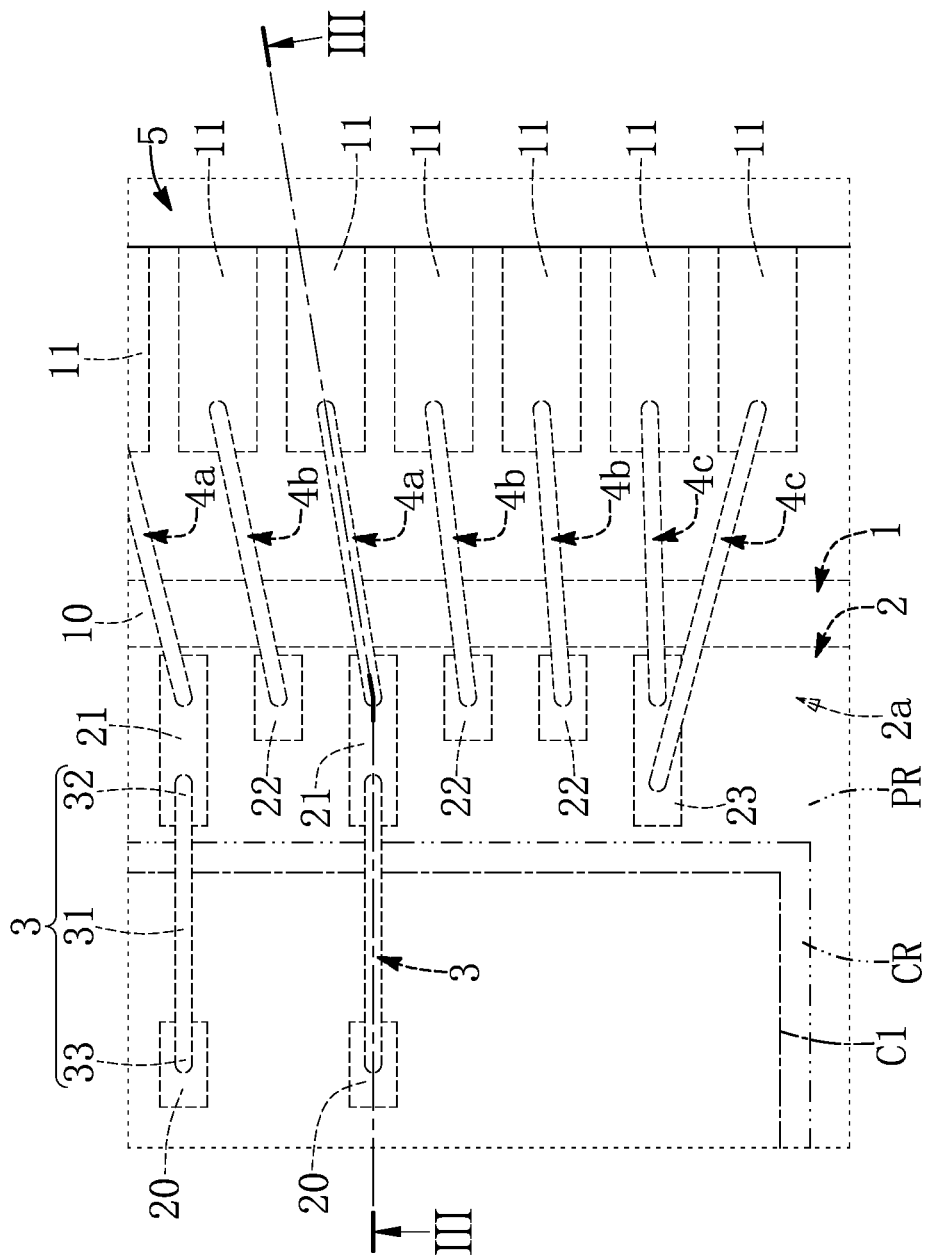
FIG. 2 is an enlarged view of part II of FIG. 1.
Figure 3:
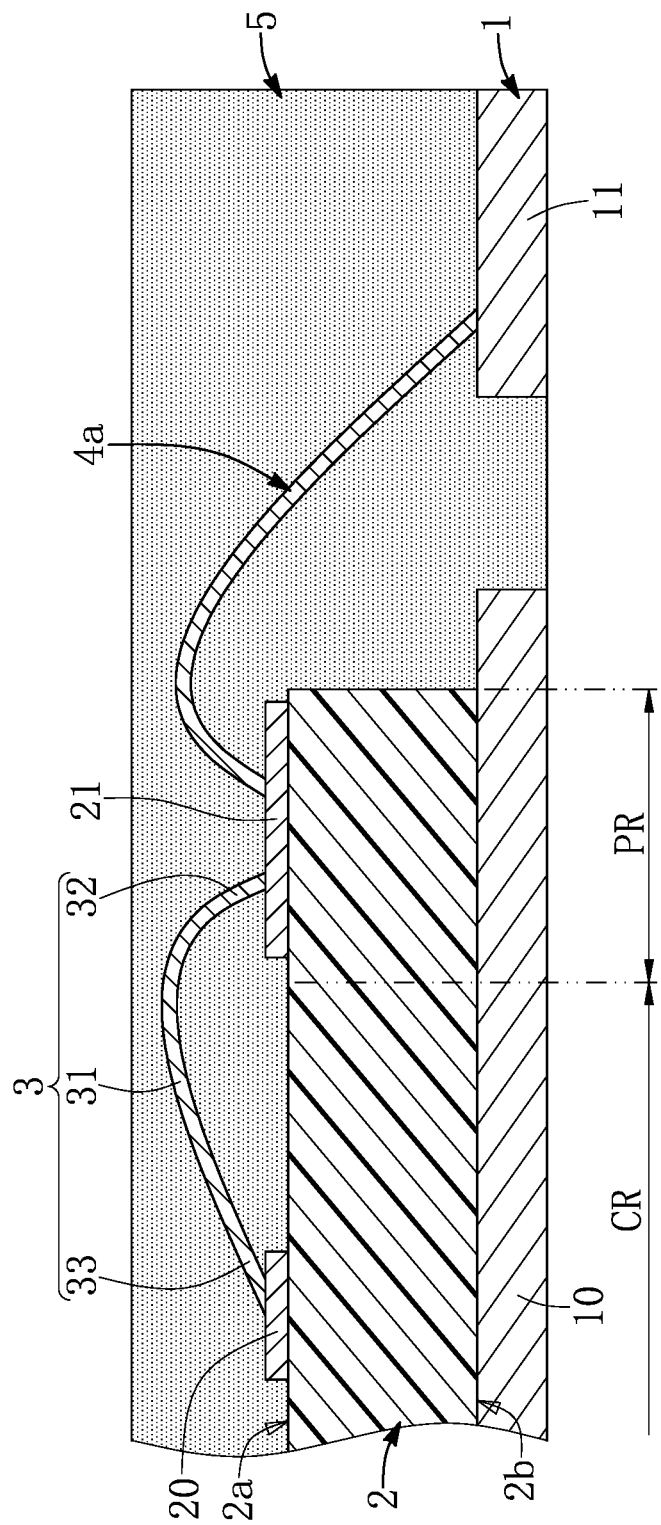
FIG. 3 is a cross-sectional view taken along line III-III of FIG. 2.

Reference is made to FIG. 1 to FIG. 3. FIG. 1 is a schematic top view of an electronic package structure according to an embodiment of the present disclosure, FIG. 2 is an enlarged view of part II of FIG. 1, and FIG. 3 is a cross-sectional view taken along line III-III of FIG. 2. An electronic package structure E1 is provided in the embodiment of the present disclosure. In the instant embodiment, the electronic package structure E1 is fabricated by a wire-bonding process, and the electronic package structure E1 includes a supporting element 1, a chip 2, at least one internal bonding wire 3, and a plurality of external bonding wires 4a to 4c.

Reference is made to FIG. 2, in which the supporting element 1 can include a chip arrangement portion 10 and a plurality of terminal portions 11. The chip arrangement portion 10 is configured so that the chip 2 can be mounted thereon. The terminal portions 11 serve as electric contacts, so that the chip 2 can be electrically connected to an external circuit, and any two of the terminal portions 11 are spaced apart from each other. As shown in FIG. 1, in the instant embodiment, the terminal portions 11 are arranged to surround the chip arrangement portion 10. To be more specific, the supporting element 1 can be a lead frame or a circuit board. In the instant embodiment, the supporting element 1 is a lead frame, but the present disclosure is not limited thereto.

The chip 2 can be a BLUETOOTH® chip, a Wi-Fi chip, an LED control chip, a system on chip, a microprocessor chip, a dynamic random access memory chip, or other devices, and the present disclosure is not limited thereto. As shown in FIG. 1, the chip 2 is disposed on the chip arrangement portion 10 of the supporting element 1, and electrically connected to the terminal portions 11. As shown in FIG. 3, in the instant embodiment, the chip 2 has a first surface 2a and a second surface 2b opposite to the first surface 2a. The chip 2 is disposed on the chip arrangement portion 10 with the second surface 2b facing toward the supporting element 1. As shown in FIG. 1 and FIG. 2, the first surface 2a of the chip 2 is divided into a core region CR and a peripheral region PR surrounding the core region CR.

As shown in FIG. 1, the core region CR is a central region of the first surface 2a of the chip 2, and the peripheral region PR is located at a periphery of the core region CR. Specifically, the peripheral region PR is located between the core region CR and an outer edge of the chip 2. It should be noted that in the instant embodiment, for ease of illustration, only a part of the core region CR and a part of the peripheral region PR at one side of the core region CR are illustrated in FIG. 2.

As mentioned above, the chip 2 further includes a core circuit C1, and the core circuit C1 is arranged to correspond to a position of the core region CR. Specifically, when the chip 2 is electrically connected to an external circuit, power can be supplied to interior devices of the chip 2 through the core circuit C1. In other words, the chip 2 can include at least one of a ground wiring layer, a power wiring layer, and a signal wiring layer that are not shown in FIG. 2, so as to form the core circuit C1, but the present disclosure is not limited to the example provided herein.

Furthermore, as shown in FIG. 2, the chip 2 includes at least one individual core pad 20 and at least one first common pad 21 that are disposed on the first surface 2a. Referring to FIG. 2, in the instant embodiment, the individual core pad 20 is located in the core region CR, and is electrically connected to the core circuit C1. Specifically, according to practical requirements, the individual core pad 20 can be electrically connected to the ground wiring layer, the power wiring layer, or the signal wiring layer of the core circuit C1. That is to say, the individual core pad 20 can serve as a ground pad, a power pad, or a signal pad. Moreover, the first common pad 21 is located in the peripheral region PR, and can also serve as a ground pad, a power pad, or a signal pad.

It should be noted that in the instant embodiment, the individual core pad 20 is configured to be connected by one conductive wire, and the first common pad 21 can be connected by at least two conductive wires. Accordingly, from the top view, an area of the first common pad 21 is greater than an area of the individual core pad 20. In one embodiment, the area of the first common pad 21 is 2 to 2.5 times the area of the individual core pad 20. As shown in FIG. 2, from the top view, the first common pad 21 is in a rectangular shape, and extends along a direction from the outer edge to the core region CR of the chip 2.

In the instant embodiment, the internal bonding wire 3 is disposed on the chip 2 and physically connected between the first common pad 21 and the individual core pad 20. Specifically, the internal bonding wire 3 has a first end 32, a second end 33 opposite to the first end 32, and a main portion 31 connected between the first end 32 and the second end 33. In the instant embodiment, the first end 32 of the internal bonding wire 3 is connected to the first common pad 21, and the second end 33 is connected to the individual core pad 20. Accordingly, the internal bonding wire 3 is disposed across a boundary between the peripheral region PR and the core region CR. When the chip 2 is electrically connected to an external circuit through the supporting element 1, the internal bonding wire 3 can provide another power supply path to improve a power integrity. The internal bonding wire 3 can be a power wire, a ground wire, or a signal wire.

Reference is made to FIG. 3. It should be noted that in the instant embodiment, the internal bonding wire 3 is disposed on the chip 2 by a wire-bonding process, and is not a metal wiring layer directly formed on the first surface 2a. Accordingly, in practice, the main portion 31 of the internal bonding wire 3 is disposed above the chip 2 and is not in contact with the first surface 2a of the chip 2. Since the main portion 31 of the internal bonding wire 3 is not a metal wiring layer directly formed on the first surface 2a of the chip 2, the internal bonding wire 3 does not occupy any space of the core region CR, and a layout region for a configuration of the core circuit C1 is not reduced.

Furthermore, the metal wiring layer directly formed in the core region CR of the first surface 2a usually has a greater thickness than that of another wiring layer so as to reduce a resistance of the metal wiring layer. However, the greater the thickness of the metal wiring layer, the larger the internal stress of the chip 2. Electric performances or functions of the circuits in the core region CR may be negatively affected due to the internal stress being too large. Since the main portion 31 of the internal bonding wire 3 in the instant embodiment is not directly formed on the first surface 2a, an increase of the internal stress can be prevented and an operation efficiency of the circuits in the core region CR is not affected. Furthermore, a parasitic resistance of the internal bonding wire 3 that is formed by a wire-bonding process is much less than that of the wiring layer (e.g., the aforementioned ground wiring layer, the power wiring layer, or the signal wiring layer) in the interior of the chip 2. Accordingly, the power integrity can be further improved by arranging the internal bonding wire 3 by a wire-bonding process.

It is worth mentioning that since the first common pad 21 of the embodiment in the present disclosure is located at the peripheral region PR, instead of the core region CR, there is no need to additionally form any wiring layer extending from the core region CR to the peripheral region PR. As such, the layout region for the core circuit C1 is prevented from being occupied by the wiring layer, and an increase of the internal stress of the chip 2 can be avoided.

However, the present disclosure is not limited to the abovementioned embodiments. In another embodiment, a part of the first common pad 21 can be located in the peripheral region PR, and another part is located in the core region CR and partially overlaps with the core circuit C1. That is to say, a portion of the core circuit C1 can be configured in a region under the first common pad 21. As such, only a small part of the layout region for the configuration of the core circuit C1 is occupied by the first common pad 21, and the aim of the present disclosure can still be achieved.

As shown in FIG. 2, the chip 2 further includes an individual peripheral pad 22 and a second common pad 23. It should be noted the quantities of different pads as depicted in FIGS. 1 and 2 are for exemplary purposes only. Accordingly, the quantities of the individual core pad 20, the first common pad 21, the second common pad 23, the internal bonding wire 3, and the individual peripheral pad 22 can be adjusted depending on practical implementations, and the present disclosure is not limited thereto.

According to functions of the chip 2, each of the individual core pad 20, the first common pad 21, the second common pad 23, and the individual peripheral pad 22 can be designated to one of signal terminals. The signal terminals include, for example, but not limited to, a VCC terminal, a VDD terminal, a VSS terminal, a power supply terminal, a clock terminal, an address signal terminal, and so on.

As shown in FIG. 2, the first common pad 21, the individual peripheral pad 22, and the second common pad 23 are jointly arranged in the peripheral region PR. In the instant embodiment, the individual peripheral pad 22 is also configured to be connected by one conductive wire, and the second common pad 23 is allowed to be connected by at least two conductive wires. Specifically, the individual peripheral pad 22 can be connected by one external bonding wire 4b, and the second common pad 23 can be connected by at least two external bonding wires 4c.

Accordingly, an area of the individual peripheral pad 22 is not only less than an area of the second common pad 23, but also less than the area of the first common pad 21. In one embodiment, the area of the second common pad 23 (or the first common pad 21) is 2 to 2.5 times the area of the individual peripheral pad 22. As shown in FIG. 2, from the top view, the second common pad 23 is in a rectangular shape and extends along a direction from the outer edge to the core region CR of the chip 2. However, in another embodiment, the second common pad 23 can be omitted.

Reference is made to FIG. 2, in which the external bonding wires 4a to 4c are connected between the chip 2 and the supporting element 1. Specifically, one end portion of each of the external bonding wires 4a to 4c is connected to the corresponding one of the pads in the peripheral region PR, and the other end portion is connected to the corresponding one of the terminal portions 11.

Reference is made to FIG. 2, which is to be read in conjunction with FIG. 3. To be more specific, the external bonding wires 4a to 4c include a first external bonding wire 4a, and the internal bonding wire 3 and the first external bonding wire 4a are jointly connected to the first common pad 21. That is, one end portion of the first external bonding wire 4a is connected to the first common pad 21, and the other end portion of the first external bonding wire 4a is connected to the corresponding one of the terminal portions 11. Since the first external bonding wire 4a and the internal bonding wire 3 are jointly connected to the first common pad 21, the internal bonding wire 3 and the first external bonding wire 4a may have the same electric potential. For example, when the internal bonding wire 3 serves as a ground wire, the first external bonding wire 4a also serves as a ground wire. Similarly, when the internal bonding wire 3 serves as a power wire, the first external bonding wire 4a also serves as another power wire.

Furthermore, referring to FIG. 2, the external bonding wires 4a to 4c include a second external bonding wire 4b, and two end portions of the second external bonding wire 4b are respectively connected to the individual peripheral pad 22 and the corresponding one of the terminal portions 11. Moreover, the external bonding wires 4a to 4c include at least two third external bonding wires 4c, and the at least two third external bonding wires 4c are jointly connected to the second common pad 23. However, the at least two third external bonding wires 4c can be respectively connected to two corresponding terminal portions 11, but the present disclosure is not limited thereto. In another embodiment, the at least two third external bonding wires 4c can be connected to the same terminal portion 11. It is worth mentioning that by connecting the at least two third external bonding wires 4c to the second common pad 23, a parasitic resistance and a parasitic inductance can be reduced.

Reference is made to FIG. 3, in which the electronic package structure E1 can further include a packaging layer 5. The packaging layer 5 covers the chip 2, the supporting element 1, the internal bonding wire 3, and the external bonding wires 4a to 4c so as to protect the chip 2, the supporting element 1, the internal bonding wire 3, and the external bonding wires 4a to 4c. However, a bottom surface of the chip arrangement portion 10 and the terminal portions 11 are not completely covered by the packaging layer 5, and are partially exposed out of the packaging layer 5. As such, the electronic package structure E1 can be assembled to another circuit board through the terminal portions 11.

However, the aforementioned details are disclosed for exemplary purposes only, and are not meant to limit the scope of the present disclosure.

Beneficial Effects of the Embodiments

In conclusion, one of advantages of the present disclosure is that in the electronic package structure and the chip thereof provided herein, by virtue of "the chip 2 including the first common pad 21 and the individual core pad 20 disposed on the first surface 2a," "the internal bonding wire 3 being connected between the first common pad 21 and the individual core pad 20," and "the internal bonding wire and a first external bonding wire 4a of the external bonding wires 4a to 4c being jointly connected to the first common pad 21," the power integrity of the electronic package structure E1 can be prevented from being reduced.

To be more specific, the internal bonding wire 3 is arranged on the chip 2 by a wire-bonding process, and the main portion 31 of the internal bonding wire 3 is not directly in contact with the first surface 2a of the chip 2. Accordingly, the internal bonding wire 3 does not occupy any space of the core region CR, and a layout region for a configuration of the core circuit C1 is not reduced. Furthermore, a thicker wiring layer, which may increase the internal stress and affect the operation efficiency of the circuit in the core region CR, does not have to be formed on the chip 2. Moreover, a parasitic resistance of the internal bonding wire 3 is much less than that of the wiring layer formed in an interior of the chip 2. Accordingly, the internal bonding wire 3 can be utilized to provide another power path, thereby improving the power integrity.

Additionally, since the first common pad 21 of the embodiment in the present disclosure is mainly located in the peripheral region PR, instead of the core region CR, there is no need to arrange an additional wiring layer extending from the core region CR to the peripheral region PR. As such, the layout region for the configuration of the core circuit C1 can be prevented from being reduced, and an increase in the internal stress of the chip 2 can be avoided.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic package structure, comprising:
a supporting element having a chip arrangement portion;
a chip having a first surface and a second surface opposite to the first surface, wherein the chip is arranged on the chip arrangement portion with the second surface facing toward the supporting element, and the chip includes a plurality of first common pads and a plurality of individual core pads that are disposed on the first surface;
a plurality of internal bonding wires, each of the plurality of internal bonding wires connected between each of the plurality of first common pads and each of the plurality of individual core pads;
a plurality of external bonding wires connected between the chip and the supporting element, wherein a first external bonding wire of the plurality of external bonding wires and one of the plurality of internal bonding wires are jointly connected to a corresponding one of the plurality of first common pads;
a second common pad disposed on the first surface; and
a plurality of individual peripheral pads disposed on the first surface;
wherein two of the plurality of first common pads, three of the plurality of individual peripheral pads, and the second common pad are disposed along an arrangement direction, such that one of the plurality of individual peripheral pads is disposed between a first one of the plurality of first common pads and a second one of the plurality of first common pads, and two of the plurality of individual peripheral pads are disposed between the second one of the plurality of first common pads and the second common pad;
wherein each of the first common pads and the second common pad has a rectangular shape and extends from an edge of the chip toward the plurality of individual core pads;
wherein an area of each of the first common pads is greater than an area of each of the individual peripheral pads, and an area of the second common pad is greater than an area of each of the individual peripheral pads; and
wherein the supporting element includes a plurality of terminal portions that are spaced apart from each other, the plurality of external bonding wires includes a second external bonding wire, and the second external bonding wire is physically connected between the individual peripheral pad and a corresponding one of the terminal portions.

2. The electronic package structure according to claim 1, wherein the first surface of the chip is divided into a core region and a peripheral region surrounding the core region, the chip includes a core circuit located in the core region, the internal bonding wire is electrically connected to the core circuit through each of the plurality of individual core pads, and the internal bonding wire is a power wire, a ground wire, or a signal wire.

3. The electronic package structure according to claim 1, wherein the first surface of the chip is divided into a core region and a peripheral region surrounding the core region, the plurality of individual core pads is located in the core region, and the plurality of first common pads is located in the peripheral region.

4. The electronic package structure according to claim 1, wherein the first surface of the chip is divided into a core region and a peripheral region surrounding the core region, and the plurality of individual peripheral pads is located in the peripheral region.

5. The electronic package structure according to claim 1, wherein an area of the second common pad is greater than an area of the individual core pad.

6. The electronic package structure according to claim 5, wherein the plurality of external bonding wires includes at least two third external bonding wires, and the at least two third external bonding wires are jointly connected to the second common pad.

7. The electronic package structure according to claim 1, wherein the internal bonding wire includes a first end, a second end opposite to the first end, and a main portion connected between the first end and the second end, and the main portion is not in contact with the first surface.

8. A chip comprising a first surface and a second surface opposite to the first surface, wherein the chip includes a plurality of first common pads, a second common pad, a plurality of individual peripheral pads and a plurality of individual core pads that are disposed on the first surface, and an area of each of the plurality of first common pads is greater than an area of each of the plurality of individual core pads;
wherein two of the plurality of first common pads, three of the plurality of individual peripheral pads, and the second common pad are disposed along an arrangement direction, such that one of the plurality of individual peripheral pads is disposed between a first one of the plurality of first common pads and a second one of the plurality of first common pads, and two of the plurality of individual peripheral pads are disposed between the second one of the plurality of first common pads and the second common pad;

wherein each of the first common pads and the second common pad has a rectangular shape and extends from an edge of the chip toward an interior portion of the chip; and wherein an area of each of the first common pads is greater than an area of each of the individual peripheral pads, and an area of the second common pad is greater than an area of each of the individual peripheral pads.

9. The chip according to claim 8, wherein the first surface of the chip is divided into a core region and a peripheral region surrounding the core region, the individual core pad is located in the core region, and the plurality of first common pads is located in the peripheral region.

10. The chip according to claim 8, wherein the first surface of the chip is divided into a core region and a peripheral region surrounding the core region, the chip includes a core circuit located in the core region, and the individual core pad is electrically connected to the core circuit and serves as a power pad, a ground pad, or a signal pad.

11. The chip according to claim 8, wherein the first surface of the chip is divided into a core region and a peripheral region surrounding the core region, and the plurality of individual peripheral pads and the plurality of first common pads are both located in the peripheral region and adjacent to an outer edge of the chip.

12. The chip according to claim 8, wherein an area of the second common pad is greater than the area of the individual core pad.

* * * * *